United States Patent
Morishita et al.

(10) Patent No.: US 12,015,091 B2
(45) Date of Patent: Jun. 18, 2024

(54) CONDUCTIVE PASTE AND METHOD FOR PRODUCING TOPCon SOLAR CELL

(71) Applicant: TOYO ALUMINIUM KABUSHIKI KAISHA, Osaka (JP)

(72) Inventors: Naoya Morishita, Osaka (JP); Marwan Dhamrin, Osaka (JP)

(73) Assignee: TOYO ALUMINIUM KABUSHIKI KAISHA, Osaka (JP)

( * ) Notice: Subject to any disclaimer, the term of this patent is extended or adjusted under 35 U.S.C. 154(b) by 20 days.

(21) Appl. No.: 17/014,412

(22) Filed: Sep. 8, 2020

(65) Prior Publication Data
US 2022/0077328 A1    Mar. 10, 2022

(51) Int. Cl.
*H01L 31/0224* (2006.01)
*B22F 9/00* (2006.01)

(52) U.S. Cl.
CPC ...... *H01L 31/022425* (2013.01); *B22F 9/008* (2013.01); *H01L 31/022441* (2013.01)

(58) Field of Classification Search
CPC .............. H01L 31/022425; H01L 31/022441
See application file for complete search history.

(56) References Cited

U.S. PATENT DOCUMENTS

| | | | | |
|---|---|---|---|---|
| 2010/0229938 A1* | 9/2010 | Nishino | ................ | C25D 7/08 428/335 |
| 2013/0153020 A1* | 6/2013 | Hahn | .................. | H01B 1/22 438/93 |
| 2014/0287583 A1* | 9/2014 | Liu | ................ | H01L 31/02168 252/514 |
| 2015/0255643 A1* | 9/2015 | Abe | ................ | H01L 31/022425 252/512 |
| 2015/0303323 A1* | 10/2015 | Li | ................ | B82Y 30/00 438/98 |
| 2020/0295206 A1* | 9/2020 | Huang | ................ | H01L 31/1868 |
| 2022/0134422 A1* | 5/2022 | Zhu | ................ | H01L 31/022425 136/256 |

FOREIGN PATENT DOCUMENTS

| | | | |
|---|---|---|---|
| CN | 103762249 B | * 3/2016 | |
| CN | 105817633 A | * 8/2016 | |
| CN | 110289121 A | * 9/2019 | ............ B22F 1/05 |
| JP | 2013-0143499 A | 7/2013 | |
| RU | 2690091 C1 | * 5/2019 | ..... H01L 31/022441 |

(Continued)

OTHER PUBLICATIONS

English translation of WO 2018180441 A1 (Year: 2018).*

(Continued)

*Primary Examiner* — Khaja Ahmad
(74) *Attorney, Agent, or Firm* — WHDA, LLP

(57) ABSTRACT

This invention provides a conductive paste and a method for producing a TOPCon solar cell, by which a TOPCon solar cell can be produced by a simple method, and additionally, a TOPCon solar cell can be constructed with excellent conversion efficiency. Specifically, the invention provides a conductive paste for use as a back electrode for TOPCon solar cells, the conductive paste comprising aluminum-silicon alloy particles, an organic vehicle, and a glass powder, the aluminum-silicon alloy particles having a silicon concentration of 25 wt % or more and 40 wt % or less.

4 Claims, 1 Drawing Sheet

(56) References Cited

FOREIGN PATENT DOCUMENTS

WO         2013/115076 A1     8/2013
WO     WO-2018180441 A1 * 10/2018   ............... C03C 8/18

OTHER PUBLICATIONS

English translation of CN 103762249 B (Year: 2016).*
Glunz et al., "The irresistible charm of a simple current flow pattern - 25% with a solar cell featuring a full-area back contact", in Proceedings of the 31st European Photovoltaic Solar Energy Conference and Exhibition, Sep. 2015, op 259-263, cited in Specification (5 pages).
Office Action dated Jan. 10, 2023 for counterpart JP Application No. 2019-115175 with English translation. (5 pages).

* cited by examiner

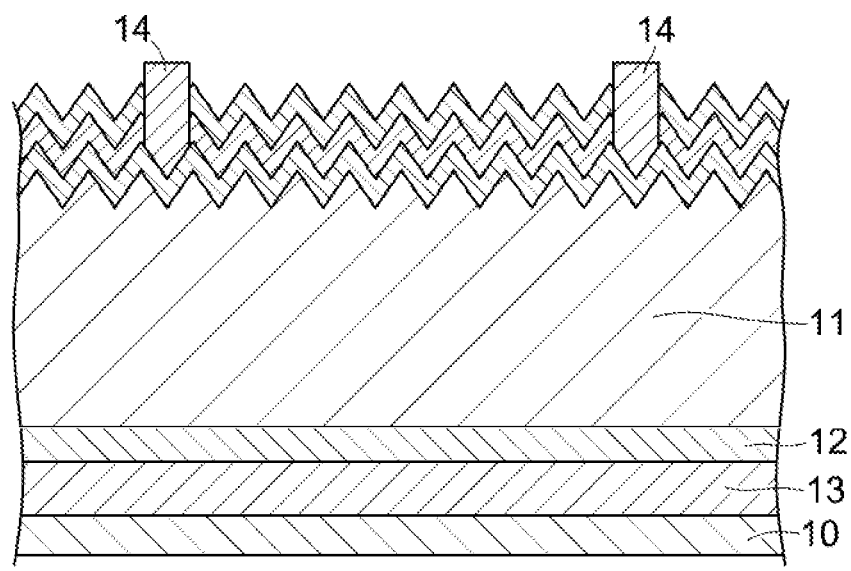

CONDUCTIVE PASTE AND METHOD FOR PRODUCING TOPCon SOLAR CELL

TECHNICAL FIELD

The present invention relates to a conductive paste and a method for producing a TOPCon solar cell.

BACKGROUND ART

In recent years, a variety of research and development has been conducted for the purpose of improving crystalline solar cells in terms of conversion efficiency (power generation efficiency), reliability, etc. In particular, TOPCon solar cells have recently been considered a promising method.

A TOPCon solar cell has a structure in which it comprises a back electrode and an n-type silicon substrate, and in which an ultra-thin oxide layer and a heavily doped microcrystalline $n^+$ silicon layer are provided by lamination between the back electrode and the n-type silicon substrate. In TOPCon solar cells, which have this structure, a tunneling effect occurs through the oxide layer, which suppresses carrier loss at the interface between the n-silicon layer and $n^+$-silicon layer. For example, Non-patent Literature (NPL) 1 proposes forming a silver electrode as a back electrode by vapor deposition in order to sufficiently reduce the contact resistance with a silicon substrate (e.g., NPL 1).

CITATION LIST

Non-Patent Literature

NPL 1: Glunz, S. W., Feldmann, F., Richter, A., Bivour, M., Reichel, C., Steinkamper, H., & Hermle, M. (2015, September). The irresistible charm of a simple current flow pattern—25% with a solar cell featuring a full-area back contact. In Proceedings of the 31st European Photovoltaic Solar Energy Conference and Exhibition (pp. 259-263).

SUMMARY OF INVENTION

Technical Problem

However, the production process in a method for forming electrodes by silver vapor deposition, such as the method disclosed in NPL 1, easily becomes complicated, and does not easily satisfy various requirements in the field of solar cells, such as cost reduction.

The present invention has been made in view of these problems. An object of the present invention is to provide a conductive paste and a method for producing a TOPCon solar cell, by which a TOPCon solar cell can be produced by a simple method, and additionally, a TOPCon solar cell can be constructed with excellent conversion efficiency.

Solution to Problem

A possible option for reducing the production costs of TOPCon solar cells and improving the conversion efficiency at the same time may be to apply aluminum instead of silver vapor deposition (or a silver paste) to the back electrode. However, the inventors analyzed the application of aluminum, and found that aluminum undergoes melting with a microcrystalline n-silicon layer, causing the formation of an aluminum-silicon alloy during sintering in the process of producing electrodes. This means that the use of an electrode simply formed from aluminum would cause carrier loss, which results in a significant reduction in conversion efficiency in TOPCon solar cells.

Based on the above findings, the inventors conducted extensive research to solve the problems, and consequently found that the problems can be solved by using a conductive paste comprising aluminum-silicon alloy particles containing a specific amount of silicon. The present invention has thus been completed.

More specifically, the present invention encompasses, for example, the subject matter described in the following items.

Item 1. A conductive paste for use as a back electrode for a TOPCon solar cell, the conductive paste comprising aluminum-silicon alloy particles, an organic vehicle, and a glass powder, the aluminum-silicon alloy particles having a silicon concentration of 25 wt % or more and 40 wt % or less.

Item 2. The conductive paste according to Item 1, wherein the aluminum-silicon alloy particles have a volume average particle size of 1 to 10 μm.

Item 3. A method for producing a TOPCon solar cell, the method comprising:
step 1 of applying a conductive paste comprising aluminum-silicon alloy particles to a surface of a silicon substrate on a side opposite to a light-receiving surface side;
step 2 of applying a silver paste composition to a surface of the silicon substrate on the light-receiving surface side; and
step 3 of sintering the silicon substrate at a sintering temperature of 700° C. or higher after steps 1 and 2, wherein the aluminum-silicon alloy particles have a silicon concentration of 25 wt % or more and 40 wt % or less.

Item 4. The production method according to Item 3, wherein the sintering temperature in step 3 is 900° C. or lower.

Advantageous Effects of Invention

The conductive paste according to the present invention is capable of producing a TOPCon solar cell by a simple method. Moreover, the conductive paste according to the present invention makes it possible to construct a TOPCon solar cell with excellent conversion efficiency.

BRIEF DESCRIPTION OF DRAWINGS

FIG. 1 is a schematic cross-sectional view showing an example of a TOPCon solar cell produced by using a conductive paste of the present invention.

DESCRIPTION OF EMBODIMENTS

Embodiments of the present invention are described below in detail. In the present specification, the expressions "contain," "comprise," and "include" have the meanings of containing, including, consisting essentially of, and consisting of. Additionally, in the present specification, a numerical range indicated by " . . . to . . . " means a range including the numerical values before and after "to" as the lower limit and the upper limit.

1. TOPCon Solar Cell

FIG. 1 is a schematic cross-sectional view showing an example of a TOPCon solar cell. As shown in FIG. 1, a TOPCon solar cell A comprises a back electrode 10, an n-type silicon substrate 11, an ultra-thin oxide layer 12, and a microcrystalline $n^+$ silicon layer 13, into which a high-concentration dopant is doped. In the TOPCon solar cell A, the oxide layer 12 and the n+ silicon layer 13 are present between the back electrode 10 and the n-type silicon substrate 11. The oxide layer 12 is disposed on the n-type silicon substrate 11 side, while the n+ silicon layer 13 is disposed on the back electrode 10 side. In the TOPCon solar cell A with this structure, a tunneling effect occurs through the oxide layer 12, thus suppressing carrier loss at the interface between the n-silicon layer (n-type silicon substrate 11) and the n+-silicon layer (n+ silicon layer 13).

For the oxide layer 12, for example, silicon oxide is applicable. The thickness of the oxide layer 12 is not limited and may be, for example, 1 to 10 nm, and preferably 3 to 8 nm. When the thickness of the oxide layer 12 is 1 to 10 nm, the tunneling effect described above easily occurs, allowing the carrier to easily move to the back surface side of the solar cell, resulting in a further increase in conversion efficiency. Further, when the thickness of the oxide layer 12 is 1 to 10 nm, the carrier loss at the interface between the n-silicon layer and the n+-silicon layer is also easily suppressed, preventing the conversion efficiency from decreasing.

For the n-type silicon substrate 11, for example, silicon substrates used in semiconductor applications and solar cell applications are widely applicable.

In the TOPCon solar cell A, a passivation membrane can also be introduced between the n+-silicon layer (n+ silicon layer 13) and the back electrode 10. The passivation membrane may have an opening as in known solar cells. Finger electrodes 14 are formed on the surface of the n-type silicon substrate 11 on a side opposite to the back electrode 10. The finger electrodes 14 may be formed of, for example, silver.

The back electrode 10 is formed by using the conductive paste of the present invention. Therefore, migration of the electrode materials does not occur in the TOPCon solar cell A, the risk of short circuit is reduced, and as a result, the conversion efficiency increases. Further, the use of the conductive paste enables the formation of the back electrode 10 by screen printing; that is, the back electrode 10 can be easily produced. The conductive paste is described below in detail.

2. Conductive Paste

The conductive paste of the present invention used for the back electrode for a TOPCon solar cell comprises aluminum-silicon alloy particles, an organic vehicle, and a glass powder. In particular, the aluminum-silicon alloy particles of the conductive paste have a silicon concentration of 25 wt % or more and 40 wt % or less.

In the conductive paste, the aluminium-silicon alloy particles serve as a component that can function to provide conductivity. That is, the aluminum-silicon alloy particles can function as a conductive substance in the back electrode for TOPCon solar cells.

When the aluminum-silicon alloy particles have a silicon concentration of 25 wt % or more and 40 wt % or less, the conductive paste does not easily undergo melting with a microcrystalline n+-silicon layer in the sintering process for forming the back electrode. Therefore, the conductive paste and the n+-silicon layer do not easily form an aluminum-silicon alloy. As a result, decrease in the conversion efficiency due to carrier loss is reduced in the TOPCon solar cell comprising the back electrode formed using the conductive paste. If the silicon concentration is less than 25 wt %, a p+ layer is formed, which causes a decrease in conversion efficiency. If the silicon concentration exceeds 40 wt %, the resistance becomes too high, and production of aluminum-silicon alloy particles becomes difficult.

The silicon concentration of the aluminum-silicon alloy particles is more preferably 30 wt % or more. Further, the silicon concentration of the aluminum-silicon alloy particles is more preferably 35 wt % or less.

The silicon concentration of the aluminum-silicon alloy particles specifically refers to the weight percentage of the silicon element in the total weight of the aluminum-silicon alloy particles. The silicon content in the aluminum-silicon alloy particles can be quantified by ICP emission spectroscopy (analysis). When a commercially available product is used as the aluminum-silicon alloy particles, for example, the silicon concentration shown as the catalog value or the guaranteed value of the aluminum-silicon alloy particles can be used as the silicon concentration of the aluminum-silicon alloy particles.

The size of the aluminum-silicon alloy particles is not particularly limited. For example, the volume average particle size D50 of the aluminum-silicon alloy particles may be 1 to 10 μm. In the present specification, the volume average particle size D50 of aluminum-silicon alloy particles refers to a value measured by a laser diffraction method. The volume average particle size D50 of the aluminum-silicon alloy particles is preferably 3 to 9 μm, and more preferably 5 to 8 μm.

The shape of the aluminum-silicon alloy particles is not particularly limited, and the aluminum-silicon alloy particles may have any shape, such as spherical, elliptical, scaly, and amorphous. The shape of the aluminum-silicon alloy particles is preferably spherical from the viewpoint of easily improving adhesion to the substrate.

The method for producing the aluminum-silicon alloy particles is not particularly limited. For example, known production methods can be widely used. More specifically, the aluminum-silicon alloy particles can be obtained by an atomizing method. The conditions of the atomizing method are not particularly limited, and may be the same as the conditions of a known atomizing method.

The content of the aluminum-silicon alloy particles in the conductive paste is also not particularly limited, and can be appropriately determined as long as the effect of the present invention is obtained. For example, the content of the aluminum-silicon alloy particles in the conductive paste may be 50 wt % or more, preferably 60 wt % or more, more preferably 70 wt % or more, and particularly preferably 75 wt % or more to easily improve the conversion efficiency. Further, the content of the aluminum-silicon alloy particles in the conductive paste may be 90 wt % or less, preferably 85 wt % or less, more preferably 80 wt % or less, and particularly preferably 78 wt % or less to easily improve the conversion efficiency.

In the conductive paste, the type of organic vehicle is not particularly limited. For example, known organic vehicles used for forming a back electrode for solar cells are widely applicable. Examples of organic vehicles include a material in which a resin is dissolved in a solvent. Alternatively, the organic vehicle may be a resin itself without a solvent.

The type of solvent is not limited. Examples include diethylene glycol monobutyl ether, diethylene glycol monobutyl ether acetate, dipropylene glycol monomethyl ether, and the like. The organic vehicle may contain one or more types of solvents.

Examples of resins include various known resins. Specific examples include ethyl cellulose, nitrocellulose, polyvinyl butyral, phenol resins, melanin resins, urea resins, xylene resins, alkyd resins, unsaturated polyester resins, acrylic resins, polyimide resins, furan resins, urethane resins, isocyanate compounds, cyanate compounds, polyethylene, polypropylene, polystyrene, ABS resins, polymethyl methacrylate, polyvinyl chloride, polyvinylidene chloride, polyvinyl acetate, polyvinyl alcohol, polyacetal, polycarbonate, polyethylene terephthalate, polybutylene terephthalate, polyphenylene oxide, polysulfone, polyimide, polyether sulfone, polyarylate, polyetheretherketone, polytetrafluoroethylene, silicon resins, and the like. The organic vehicle may contain one or more types of resins.

The organic vehicle can also optionally contain various additives. Examples of additives include antioxidants, corrosion inhibitors, defoamers, thickeners, tackifiers, coupling agents, electrostatic imparting agents, polymerization inhibitors, thixotropic agents, antisettling agents, and the like. Specific examples include polyethylene glycol ester compounds, polyethylene glycol ether compounds, polyoxyethylene sorbitan ester compounds, sorbitan alkyl ester compounds, aliphatic polycarboxylic acid compounds, phosphoric acid ester compounds, amideamine salts of polyester acids, polyethylene oxide compounds, fatty acid amide waxes, and the like.

The ratio of the resin, the solvent, and the additive contained in the organic vehicle can be appropriately adjusted. For example, the component ratio may be the same as that of a known organic vehicle.

The content of the organic vehicle in the conductive paste is not particularly limited. For example, from the viewpoint of achieving excellent printability, the organic vehicle content is preferably 10 parts by mass or more and 500 parts by mass or less, and particularly preferably 20 parts by mass or more and 45 parts by mass or less, based on 100 parts by weight of the aluminum-silicon alloy particles.

In the conductive paste, the type of glass powder is not particularly limited. For example, known glass powders used for forming a back electrode for solar cells are widely applicable. The glass powder may contain, for example, at least one member selected from the group consisting of lead (Pb), bismuth (Bi), vanadium (V), boron (B), silicon (Si), tin (Sn), phosphorus (P), and zinc (Zn). Further, a lead-containing glass powder or a lead-free glass powder, such as a bismuth-based, vanadium-based, tin-phosphorus-based, zinc-borosilicate-based, and alkali-borosilicate-based glass powder, may be used. In particular, in view of the influence on the human body, the glass powder is preferably a lead-free glass powder. The glass powder also preferably has a softening point of 650° C. or lower. The volume average particle size D50 of the glass particles constituting the glass powder may be, for example, 1 to 3 am.

The content of the glass powder in the conductive paste is not particularly limited. For example, from the viewpoint of achieving excellent balance between the adhesion to the substrate and the electrical resistance of the formed electrodes, the content of the glass powder may be 0.5 parts by mass or more and 40 parts by mass or less, and more preferably 4 parts by mass or more and 15 parts by mass or less, based on 100 parts by mass of the aluminum-silicon alloy particles.

The conductive paste may further contain other components in addition to the aluminum-silicon alloy particles, the organic vehicle, and the glass powder. The content of the other components when contained in the conductive paste may be 5 wt % or less, preferably 1 wt % or less, more preferably 0.1 wt % or less, and particularly preferably 0.05 wt % or less, based on the total weight of the conductive paste. The conductive paste may consist only of the aluminum-silicon alloy particles, the organic vehicle, and the glass powder.

The method for preparing the conductive paste is not particularly limited. For example, the conductive paste can be obtained by mixing a predetermined amount of aluminum-silicon alloy particles, organic vehicle, and glass powder. The mixing means is also not particularly limited. For example, a known mixer may be used.

The conductive paste, which comprises the aluminum-silicon alloy particles described above as essential components, can form a back electrode for solar cells by, for example, screen printing. Therefore, a back electrode for solar cells can be produced by a simpler method, compared to the case in which a silver paste is used. Moreover, when a back electrode for solar cells is formed by using the conductive paste of the present invention, the resulting TOPCon solar cell has excellent conversion efficiency. Additionally, the back electrode for solar cells formed by using the conductive paste can form excellent ohmic contact with the silicon substrate, and the loss of conversion efficiency in TOPCon solar cells can be easily reduced.

3. Method for Producing TOPCon Solar Cell

The method for producing a TOPCon solar cell of the present invention (referred to below as "the production method of present invention") is not particularly limited. For example, the production method of the present invention can comprise the following steps 1 to 3.

Step 1: applying a conductive paste comprising aluminum-silicon alloy particles to a surface of a silicon substrate on a side opposite to a light-receiving surface side.

Step 2: applying a silver paste composition to a surface of the silicon substrate on the light-receiving surface side.

Step 3: sintering the silicon substrate at a sintering temperature of 700° C. or higher after steps 1 and 2.

In the production method of the present invention, in particular, the silicon concentration of the aluminum-silicon alloy particles used in step 1 is 25 wt % or more and 40 wt % or less.

For the silicon substrate used in step 1, for example, known silicon substrates applicable to solar cells can be widely used. For example, the silicon substrate may be a silicon substrate with a purity of 99% or more. The silicon substrate may contain elements other than silicon as impurities or additives. The silicon substrate may have, for example, the oxide layer (silicon oxide layer) described above with reference to FIG. 1 on one surface (in particular, on the side opposite to the light-receiving surface side), or may have an $n^+$-silicon layer, or may have both. When the silicon substrate has both the oxide layer (silicon oxide layer) and $n^+$-silicon layer, for example, the oxide layer (silicon oxide layer) and the $n^+$-silicon layer are stacked in this order from the silicon substrate. A passivation membrane may also be formed on the surface of the $n^+$-silicon layer. The passivation membrane may also be formed on the light-receiving surface of the silicon substrate.

The silicon substrate used in step 1 can be obtained, for example, by slicing an ingot and forming the slice into a desired shape. The thickness of the silicon substrate is not particularly limited, and can be adjusted to a desirable thickness according to the intended use. For example, the thickness of the silicon substrate may be 150 μm or more and 550 μm or less, and particularly preferably 150 μm or more and 250 μm or less. The silicon substrate may be formed of a p-type semiconductor, an n-type semiconductor, or an intrinsic semiconductor.

The conductive paste comprising aluminum-silicon alloy particles used in step 1 is equal to the conductive paste of the present invention described above. Therefore, the aluminum-silicon alloy particles contained in the conductive paste have a silicon concentration of 25 wt % or more and 40 wt % or less.

In step 1, the method for applying the conductive paste to the silicon substrate is not particularly limited. The method for application may be, for example, screen printing, spin coating, and the like, and other methods can also be used. To more simply produce a solar cell, screen printing is preferable. The conductive paste can be printed in a desired shape.

The amount of the conductive paste applied to the silicon substrate is not particularly limited, and may be, for example, 0.5 g/pc or more and 1.0 g/pc or less.

By step 1 described above, a coating film of the conductive paste is formed on the surface of the silicon substrate on the side opposite to the light-receiving surface side.

In step 2, for example, a silver paste composition can be applied to the silicon substrate on which the coating film of the conductive paste was formed in step 1. The silver paste oviposition can be applied to the surface of the silicon substrate on the light-receiving surface side. That is, step 2 can be performed after step 1. Of course, it is also possible to perform step 2 before step 1.

The type of the silver paste composition used in step 2 is not limited as long as a silver electrode for a solar cell can be formed, and known silver paste compositions can be widely used. The application method for the silver paste composition and application conditions are also not limited, and known methods and conditions can be used.

By step 2 described above, a coating film of the silver paste is formed on the surface of the silicon substrate on the light-receiving surface side.

In step 3, the silicon substrate on which the coating film of the conductive paste and the coating film of the silver paste are formed in steps 1 and 2 is sintered. Accordingly, the coating film of the conductive paste and the coating film of the silver paste are sintered to form a back electrode and a silver electrode, respectively.

In step 3, the sintering temperature is 700° C. or higher. Therefore, electrodes are easily formed on the silicon substrate, and the conductive paste and the $n^+$-silicon layer do not easily form an aluminum-silicon alloy. For example, the upper limit of the sintering temperature is preferably lower than the melting point of the aluminum-silicon alloy particles contained in the conductive paste. This makes it more difficult for the conductive paste and the $n^+$-silicon layer to form an aluminum-silicon alloy. From this viewpoint, the sintering temperature is preferably 900° C. or lower, more preferably 850° C. or lower, and particularly preferably 800° C. or lower.

The sintering time can be appropriately determined according to the sintering temperature. For example, the sintering time can be 1 minute or more and 300 minutes or less, and preferably 1 minute or more and 5 minutes or less. The sintering in step 3 may be performed in an air atmosphere or a nitrogen atmosphere. The sintering method is also not particularly limited. For example, the sintering treatment can be performed in a known heating furnace.

The production method of the present invention may comprise a further step in addition to steps 1 to 3.

The TOPCon solar cell obtained by the production method of the present invention comprises a back electrode formed by using the conductive paste of the present invention. For this reason, the TOPCon solar cell can be produced by a simple method. Moreover, the TOPCon solar cell obtained by the production method of the present invention also has excellent conversion efficiency.

EXAMPLES

The present invention is described in more detail below with reference to Examples; however, the present invention is not limited to the embodiments of these Examples.

Example 1

Aluminum-silicon alloy particles were produced by a gas atomizing method. The aluminum-silicon alloy particles were produced to have a silicon concentration of 30 wt % and a volume average particle size D50 of 6.0 μm. The obtained aluminum-silicon alloy particles (100 parts by mass) and a bismuth-based glass powder (5 parts by mass) were dispersed using a dispersion device (disperser) in 30 parts by mass of a 10 mass % resin liquid obtained by dissolving ethyl cellulose in butyl diglycol (organic vehicle), thus obtaining a conductive paste.

Example 2

A conductive paste was obtained in the sane manner as in Example 1 except that the aluminum-silicon alloy particles were produced to have a silicon concentration of 40 wt %.

Example 3

A conductive paste was obtained in the sane manner as in Example 1 except that the aluminum-silicon alloy particles were produced to have a silicon concentration of 25 wt %.

Comparative Example 1

A conductive paste was obtained in the sane manner as in Example 1 except that the aluminum-silicon alloy particles were produced to have a silicon concentration of 20 wt %.

Test Method

A solar cell wafer was prepared in which an oxide (silicon oxide) layer with a thickness of 5 nm and a microcrystalline $n^+$-silicon layer were laminated from the inside in this order on a surface of an n-type silicon substrate on the side opposite to the light-receiving surface side, and in which a passivation membrane was formed on both the light-receiving surface and the surface on the opposite side (the surface of the $n^+$-silicon layer). An opening was provided in advance with the passivation membrane on the back surface side by using a laser or the like. The conductive pastes prepared in the Examples and the Comparative Example were individually screen-printed in an amount of 0.7 to 0.8 g/pc on the surface (passivation membrane) of the solar cell wafer on the side opposite to the light-receiving surface side, and then a known Ag paste was applied to the surface on the light-receiving surface side. Subsequently, the solar cell wafer was placed in an infrared belt furnace set to 800° C. and sintered at this temperature to form electrodes (back electrode and silver electrode). TOPCon solar cells were thus produced. The short-circuit current ($I_{SC}$) and the open-circuit voltage ($V_{OC}$) of the thus produced TOPCon solar cells were measured by I-V measurement with an I-V measurement device, IV15040-10, and a solar simulator, WXS-156S-10, manufactured by Wacom Electric Co., Ltd. Additionally, the curve factor (FF) and conversion efficiency Eff were calculated. The curve factor (FF) was based on a commercially available solar simulator.

Table 1 shows the evaluation results of the TOPCon solar cells produced using the conductive pastes obtained in the Examples and the Comparative Example.

TABLE 1

|  | Si concentration of aluminum-silicon alloy particles (%) | $I_{sc}$ (A) | $V_{OC}$ (V) | FF | Eff (%) |
| --- | --- | --- | --- | --- | --- |
| Example 1 | 30.0 | 10.318 | 0.680 | 0.805 | 23.215 |
| Example 2 | 40.0 | 10.305 | 0.679 | 0.801 | 23.035 |
| Example 3 | 25.0 | 10.322 | 0.680 | 0.804 | 23.194 |
| Comparative Example 1 | 20.0 | 9.523 | 0.667 | 0.782 | 20.415 |

According to Table 1, the TOPCon solar cells obtained by using the conductive pastes comprising aluminum-silicon alloy particles having an Si concentration of 25 to 40 wt % (Examples 1 to 3) showed excellent conversion efficiency. In contrast, the TOPCon solar cell obtained by using the conductive paste comprising aluminum-silicon alloy particles having an Si concentration that is outside the range of 25 to 40 wt % (Comparative Example 1) showed low conversion efficiency. The TOPCon solar cells obtained by using the conductive pastes comprising aluminum-silicon alloy particles with an Si concentration of 25 to 40 wt % showed excellent conversion efficiency presumably because the back electrode was formed without the silicon wafer and aluminum-silicon alloy particles undergoing melting during sintering (step 3).

DESCRIPTION OF THE REFERENCE NUMERALS

A: TOPCon solar cell
10: Back electrode 10
11: n-type silicon substrate 11
12: Oxide layer
13: n$^+$ Silicon layer
14: Finger electrode

The invention claimed is:

1. A conductive paste for use as a back electrode for a TOPCon solar cell, the conductive paste comprising aluminum-silicon alloy particles, an organic vehicle, and a glass powder, the aluminum-silicon alloy particles having a silicon concentration of 25 wt % or more and 40 wt % or less,
   the content of the aluminum-silicon alloy particles in the conductive paste being 50 wt % or more,
   the content of the components of the conductive paste other than the aluminum-silicon alloy particles, the organic vehicle, and the glass powder being 5 wt % or less,
   the glass powder comprising at least one member selected from the group consisting of lead (Pb), bismuth (Bi), vanadium (V), boron (B), tin (Sn), phosphorus (P), zinc (Zn), and a lead-free glass powder, and
   the lead-free glass powder being at least one member selected from the group consisting of bismuth-based, vanadium-based, tin-phosphorus-based, zinc-borosilicate-based, and alkali-borosilicate-based glass powders.

2. The conductive paste according to claim 1, wherein the aluminum-silicon alloy particles have a volume average particle size of 1 to 10 μm.

3. A method for producing a TOPCon solar cell by using the conductive paste according to claim 1, the method comprising:
   step 1 of applying the conductive paste comprising aluminum-silicon alloy particles to a surface of a silicon substrate on a side opposite to a light-receiving surface side;
   step 2 of applying a silver paste composition to a surface of the silicon substrate on the light-receiving surface side; and
   step 3 of sintering the silicon substrate at a sintering temperature of 700° C. or higher after steps 1 and 2.

4. The production method according to claim 3, wherein the sintering temperature in step 3 is 900° C. or lower.

* * * * *